United States Patent
Yoo

(10) Patent No.: US 9,136,275 B2
(45) Date of Patent: Sep. 15, 2015

(54) SEMICONDUCTOR DEVICE

(71) Applicant: SK Hynix Inc., Icheon-si, Gyeonggi-do (KR)

(72) Inventor: Deung Kak Yoo, Icheon-si (KR)

(73) Assignee: SK HYNIX INC., Gyeonggi-do (KR)

( * ) Notice: Subject to any disclaimer, the term of this patent is extended or adjusted under 35 U.S.C. 154(b) by 153 days.

(21) Appl. No.: 14/026,788

(22) Filed: Sep. 13, 2013

(65) Prior Publication Data
US 2014/0332873 A1 Nov. 13, 2014

(30) Foreign Application Priority Data
May 13, 2013 (KR) .................. 10-2013-0053990

(51) Int. Cl.
H01L 29/792 (2006.01)
H01L 27/115 (2006.01)
H01L 29/788 (2006.01)
H01L 29/66 (2006.01)

(52) U.S. Cl.
CPC .... *H01L 27/11556* (2013.01); *H01L 27/11551* (2013.01); *H01L 27/11578* (2013.01); *H01L 27/11582* (2013.01); *H01L 29/66825* (2013.01); *H01L 29/66833* (2013.01); *H01L 29/7889* (2013.01); *H01L 29/7926* (2013.01)

(58) Field of Classification Search
CPC ............. H01L 27/11582; H01L 27/11556; H01L 27/11578; H01L 27/11551; H01L 27/0688; H01L 27/11568; H01L 29/7926; H01L 29/66825; H01L 29/66833; H01L 29/792; H01L 21/764; H01L 29/7889
See application file for complete search history.

(56) References Cited

U.S. PATENT DOCUMENTS

| | | | | |
|---|---|---|---|---|
| 2010/0006922 A1* | 1/2010 | Matsuoka et al. | ............ | 257/324 |
| 2010/0171163 A1* | 7/2010 | Kim et al. | ............ | 257/314 |
| 2010/0237400 A1* | 9/2010 | Aoyama | ............ | 257/324 |
| 2011/0024818 A1* | 2/2011 | Ahn | ............ | 257/314 |
| 2012/0012921 A1* | 1/2012 | Liu | ............ | 257/326 |
| 2012/0092926 A1* | 4/2012 | Whang et al. | ............ | 365/185.01 |
| 2012/0299005 A1* | 11/2012 | Lee | ............ | 257/66 |
| 2013/0032873 A1* | 2/2013 | Kiyotoshi | ............ | 257/324 |
| 2013/0161726 A1* | 6/2013 | Kim et al. | ............ | 257/324 |
| 2013/0292757 A1* | 11/2013 | Aritome | ............ | 257/316 |
| 2014/0008714 A1* | 1/2014 | Makala et al. | ............ | 257/324 |
| 2014/0167131 A1* | 6/2014 | Lu et al. | ............ | 257/316 |

FOREIGN PATENT DOCUMENTS

KR 10-2013-0123165 11/2013

OTHER PUBLICATIONS

Jae Sung Sim et al., "Self Aligned Trap-Shallow Trench Isolation Scheme for the Reliability of TANOS (TaN/AlO/SiN/Oxide/Si) NAND Flash Memory", 2007; IEEE; 2 pages.

* cited by examiner

Primary Examiner — Marvin Payen
Assistant Examiner — Jeremy Joy
(74) Attorney, Agent, or Firm — Lowe Hauptman & Ham, LLP

(57) ABSTRACT

A semiconductor device includes at least one channel layer, insulating layers stacked on top of one another while surrounding the at least one channel layer, first grooves and second grooves alternately interposed between the insulating layers, wherein the first groves have a greater width than the second grooves having a second width, and conductive layers formed in the first grooves.

20 Claims, 9 Drawing Sheets

SEMICONDUCTOR DEVICE

CROSS-REFERENCE TO RELATED APPLICATION

The present application claims priority to Korean patent application number 10-2013-0053990, filed on May 13, 2013, which is incorporated herein by reference in its entirety.

TECHNICAL FIELD

The present disclosure relates to a semiconductor device and, more particularly, to a three-dimensional (3D) semiconductor device.

BACKGROUND

A non-volatile memory device retains data stored therein even in the absence of power supply. Two-dimensional memory devices being manufactured as a single layer on a silicon substrate are reaching physical limits in increasing the degree of integration. Accordingly, three-dimensional (3D) non-volatile memory devices that have memory cells stacked in a vertical direction on a silicon substrate have been proposed.

A 3D non-volatile memory device includes interlayer insulating layers and word lines stacked alternately with each other, and channel layers passing therethrough. Memory cells are stacked along the channel layers. Each of the memory cells includes a data storage layer for storing data.

When a 3D non-volatile memory device is manufactured, memory cells are stacked on top of one another and are formed at the same time in order to simplify manufacturing processes. However, in this 3D non-volatile memory device, since data storage layers of the stacked memory cells are coupled to each other, data retention characteristics of the memory device can be negatively impacted.

SUMMARY

Exemplary embodiments relate to a semiconductor device having improved data retention characteristics.

A semiconductor device according to some embodiments includes a channel layer, a first insulating layer surrounding the channel layer, a second insulating layer over and spaced apart from the first insulating layer to form a first groove between the first insulating layer and the second insulating layer, the first groove having a width W1, a third insulating layer over and spaced apart from the second insulating layer to form a second groove between the second insulating layer and the third insulating layer, the second groove having a width W2, wherein the W1 is greater than W2, and a first conductive layer in the first groove.

A semiconductor device according to some embodiments includes at least one channel layer, insulating layers stacked while surrounding the at least one channel layer, first grooves and second grooves alternately interposed between the insulating layers, conductive layers formed in the first grooves, and data storage patterns surrounding the channel layers and separated from each other by the second grooves.

A semiconductor device according to some embodiments includes at least one channel layer, insulating layers stacked while surrounding the at least one channel layer, first grooves interposed between the insulating layers, second grooves interposed between the first grooves and the insulating layers, data storage patterns surrounding the channel layers and separated from each other by the second grooves, and conductive layers formed in the first and second grooves.

DESCRIPTION OF EMBODIMENTS

Figure 1A:
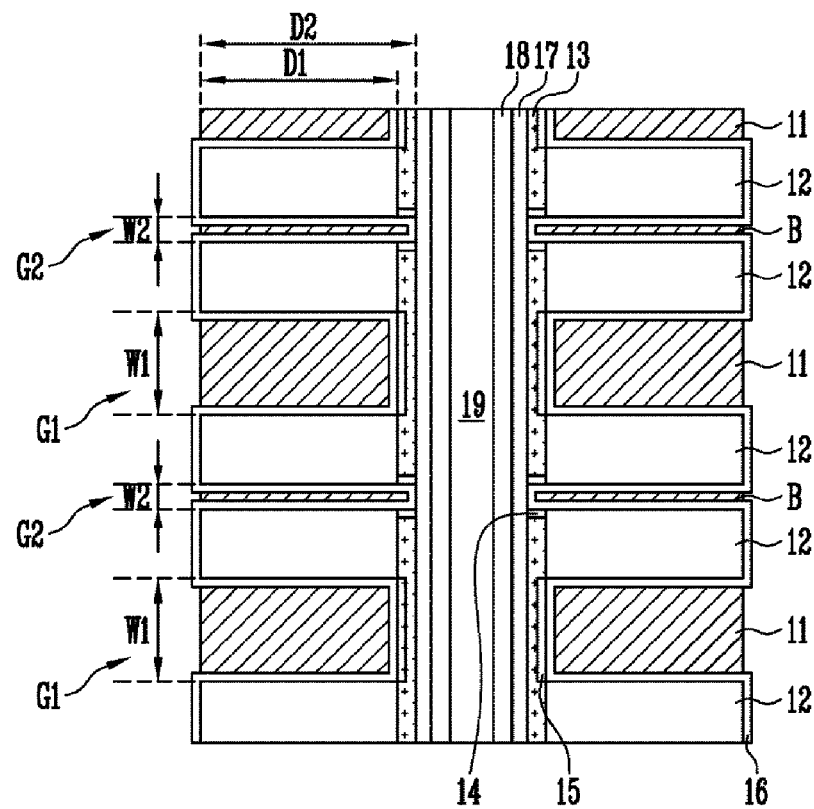
FIGS. 1A to 1C are cross-sectional views of the structure of a semiconductor device according to some embodiments.

Hereinafter, various embodiments will be described with reference to the accompanying drawings. In the drawings, illustrated thicknesses and distances of components are exaggerated compared to an actual physical thickness and interval for convenience of illustration. In the following description, detailed explanation of known related functions and constitutions may be omitted to avoid unnecessarily obscuring the subject matter disclosed herein. Like reference numerals refer to like elements throughout the specification and drawings.

Figure 1B:
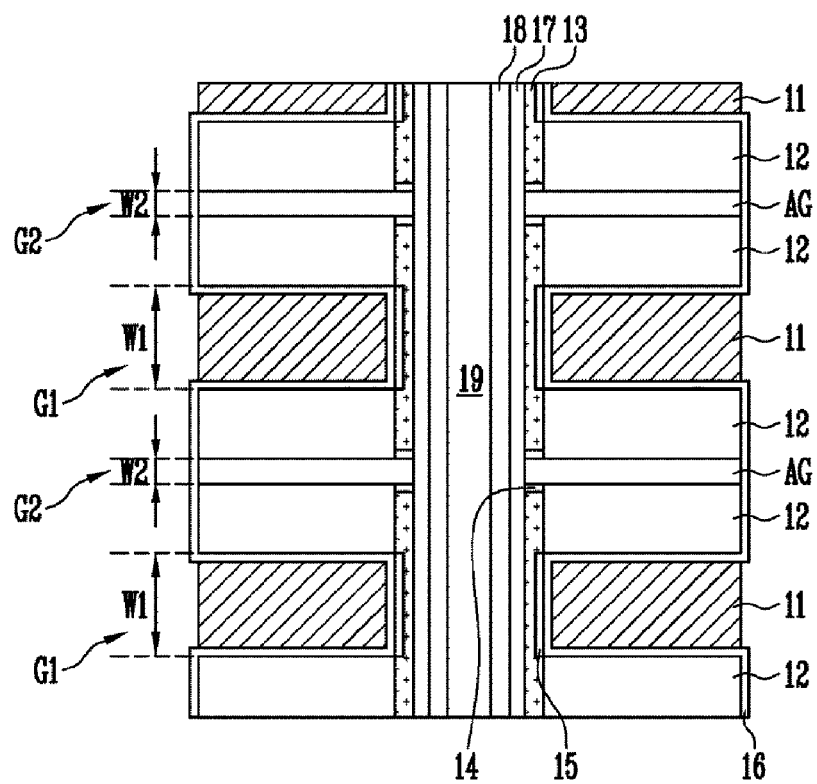
Figure 1C:
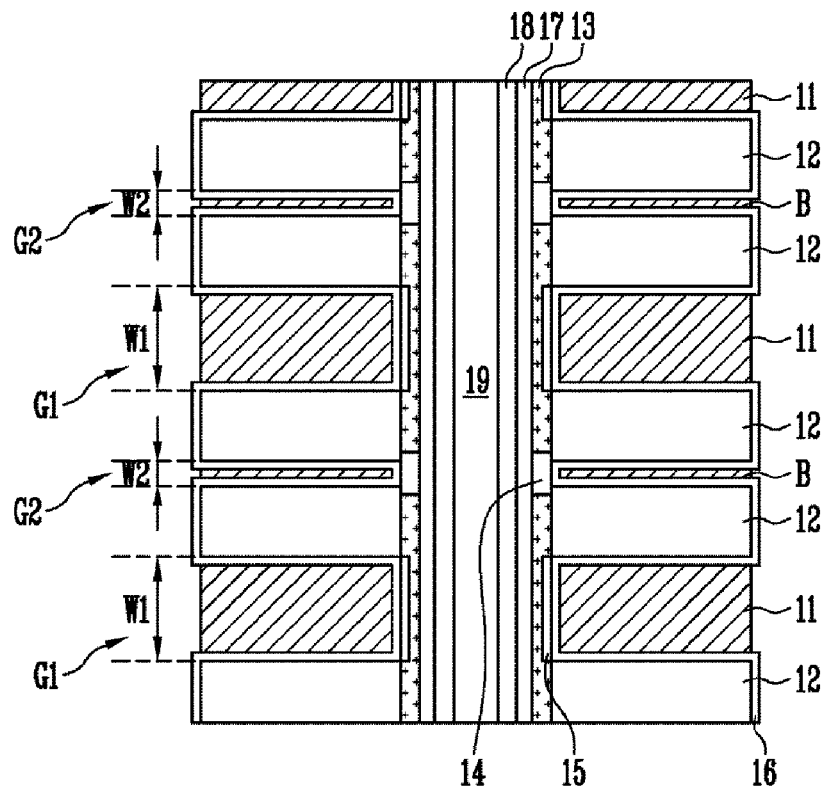

FIGS. 1A to 1C are cross-sectional views of a semiconductor device according to some embodiments. Only the memory cell region is shown for illustration purposes.

As illustrated in FIGS. 1A to 1C, a semiconductor device includes at least one channel layer 18, at least two conductive layers 11, at least two insulating layers 12, at least one first groove G1 and at least one second groove G2.

The channel layer 18 protrudes from a substrate. For example, the channel layer 18 can have various shapes, such as a straight shape, a U shape and a W shape. Memory cells are stacked vertically, in three dimensions, along the channel layer 18. The channel layer 18 is formed in a tubular shape having an open central portion, in a pillar shape having a central portion completely filled, or in a combination thereof. When the channel layer 18 has a tubular shape, an insulating layer 19 is formed in an open central portion thereof.

The insulating layers 12 surround a side surface of the channel layer 18. The insulating layers 12 are stacked at predetermined intervals along the channel layer 18. The insulating layers 12 include an oxide layer.

Regions between the insulating layers 12 are defined as the first grooves G1 or the second grooves G2. The first grooves G1 and the second grooves G2 are alternately arranged between the insulating layers 12. A width W1 of each of the first grooves G1 and a width W2 of each of the second grooves G2 are different from each other (i.e., W1≠W2). For example, the width W1 of the first groove G1 is greater than the width W2 of the second grooves G2, i.e., W1>W2. In addition, a depth D2 of each of the second grooves G2 is different from a depth D1 of each of the first groove G1s (i.e., D2≠D1). For example, the depth D2 of the second groove G2 is greater than the depth D1 of the first grooves G1 (i.e., D2>D1).

Each of the conductive layers 11 is formed in each of the first grooves G1. The conductive layers 11 are stacked upon one another while surrounding the channel layer 18. The conductive layers 11 include a metal layer such as tungsten (W), copper (Cu) or aluminum (Al) and combinations thereof. For example, when the channel layer 18 has a straight shape, at least one of the uppermost conductive layers 11 is an upper selection line, at least one of the lowermost conductive layers 11 is a lower selection line, and the other conductive layers 11 are word lines. In another example, when the channel layer 18 has a U shape, at least one of the uppermost conductive layers 11 is a selection line, and the remaining conductive layers 11 are word lines.

The semiconductor device further includes data storage patterns 13 that surround the channel layer 18. The data storage patterns 13 are located between the channel layer 18 and the insulating layers 12 and between the channel layer 18 and the conductive layers 11. In addition, the data storage patterns 13 are spaced apart with a predetermined distance and separated from each other by the second grooves G2. For example, each of the data storage patterns 13 include at least one of a charge trap layer, such as a silicon nitride layer, a charge storing layer, such as a polysilicon layer, nanodots, or a phase-change material layer.

The semiconductor device further includes a tunnel insulating layer 17. The tunnel insulating layer 17 surrounds the channel layer 18 and is interposed between the channel layer 18 and the data storage patterns 13.

First charge blocking layers 15 are formed on surfaces of the data storage patterns 13 exposed through the first grooves G1. In addition, the semiconductor device includes second charge blocking layers 16. The second charge blocking layers 16 are interposed between the first charge blocking layers 15 and the conductive layers 11. For example, the second charge blocking layers 16 are formed on surfaces of the first grooves G1 and the second grooves G2.

The semiconductor device further includes spacers 14 that are formed on sidewalls of the data storage patterns 13. For example, the spacers 14 include an oxide layer. The spacers 14 protect the data storage patterns 13, exposed through the second grooves G2, and separate the data storage patterns 13 from each other. As illustrated in FIG. 1A, the spacers 14 are formed on the sidewalls of the data storage patterns 13. The second charge blocking layers 16 are formed between the spacers 14, or the second charge blocking layers 16 and the barrier layers B are formed between the spacers 14.

In some embodiments, as illustrated in FIG. 1B, the spacers 14 are formed on the sidewalls of the data storage patterns 13. Air gaps AG are formed between the spacers 14. In some embodiments, as illustrated in FIG. 1C, the spacers 14 completely fill-in between the data storage patterns 13 adjacent to each other. For example, the spacers 14 include an oxide layer in some embodiments.

In some embodiments the barrier layers B, the air gaps AG, or a combination thereof may be formed between the spacers 14. Returning to FIG. 1A, in some embodiments the semiconductor device includes multiple barrier layers B or the multiple air gaps AG formed in the second grooves G2. In some embodiments, the barrier layers B are formed at the same time as the conductive layers 11 are formed and of the same metal. In addition, the barrier layers B includes a metal layer such as tungsten (W), copper (Cu), or aluminum (Al) and combinations thereof. In some embodiments, inside surfaces of the second grooves G2 remain empty to thereby form the air gaps AG. For example, as the second charge blocking layers 16 and the conductive layer 11 are formed, the second grooves G2 are so narrow that the insides of the second grooves G2 remain empty without being deposited with materials. In some embodiments, as shown in FIG. 1B, openings of the second grooves G2 are blocked by the second charge blocking layers 16, and the air gaps AG are defined in the second grooves G2.

As described above, the data storage patterns 13 of stacked memory cells are separated from each other. In particular, vertical movement of charges between the stacked memory cells is blocked by forming the spacers 14 on the sidewalls of the data storage patterns 13. As a result, data retention characteristics are improved. In addition, since the barrier layers B or the air gaps AG are formed between the stacked memory cells, capacitance between the stacked conductive layers 11 is reduced. Therefore, when the stacked memory cells are driven, electrical interference is reduced.

Figure 2:
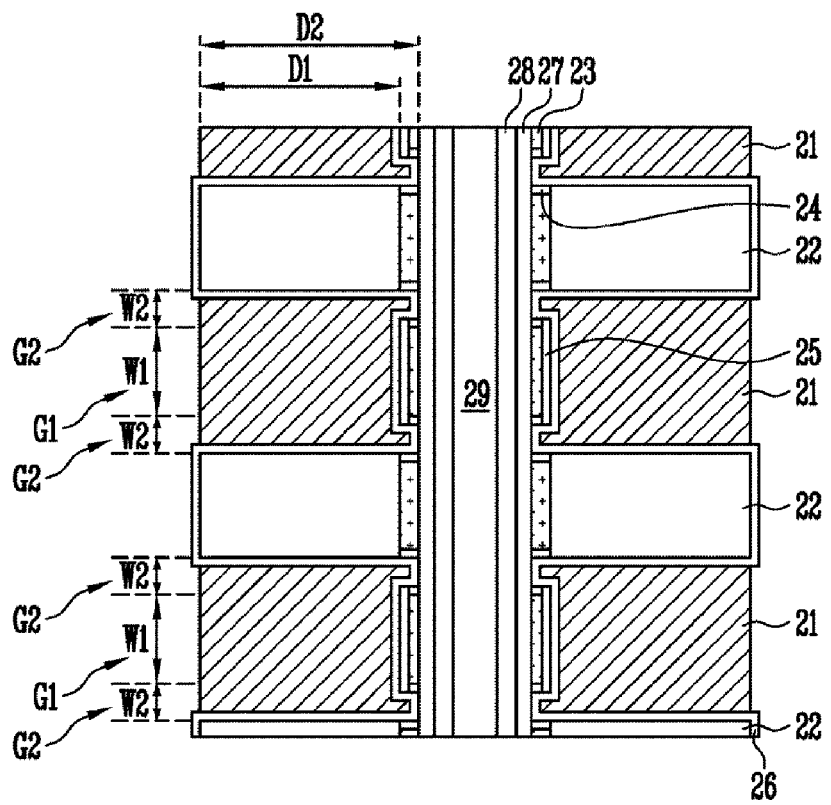
FIG. 2 is a cross-sectional view of the structure of a semiconductor device according to some embodiments.

FIG. 2 is a cross-sectional view of a semiconductor device according to some embodiments. For illustration purposes, only the memory cell region is shown. Hereinafter, a description of common contents with earlier described embodiments is omitted.

As illustrated in FIG. 2, a semiconductor device includes a channel layer 28, conductive layers 21, insulating layers 22, first grooves G1, second grooves G2 and data storage patterns 23.

The channel layer 28 is formed in a tubular shape manner. An insulating layer 29 is formed in an open central portion of the channel layer 28. A tunnel insulating layer 27 is interposed between the channel layer 28 and the data storage patterns 23. The tunnel insulating layer 27 surrounds the channel layer 28.

The insulating layers 22 are vertically stacked at predetermined intervals along the channel layer 28. The first grooves G1 and the second grooves G2 are located between the insulating layers 22. More specifically, the first grooves G1 are located between the insulating layers 22, and the second grooves G2 are located between the first grooves G1 and the insulating layers 22. In this example, the second grooves G2 are located above and below the first grooves G1, and the first and second grooves G1 and G2 meet. In this example, a width W1 of each of the first grooves G1 is greater than a width W2 of each of the second grooves G1, i.e., W1>W2, and a depth D2 of each of the second grooves G2 is greater than a depth D1 of each of the first grooves G1 (i.e., D2>D1).

The conductive layers 21 are formed in the first groove G1 and second groove G2. The first grooves G1 and the second grooves G2 and stacked on top of one another while surrounding the channel layer 28. The conductive layers 21, formed in the second grooves G2, protrude more than the conductive layers 21, formed in the first grooves G1. Therefore, each of the conductive layers 21 completely surrounds three sides of each of the data storage patterns 23 exposed through the first and second grooves G1 and G2.

The data storage patterns 23 are separated from each other by the second grooves G2. The data storage patterns 23 are interposed between the channel layer 28 and the conductive layers 21 and between the channel layer 28 and the insulating layers 22. The data storage patterns 23, interposed between the channel layer 28 and the conductive layers 21, among the data storage patterns 23 function as substantial data storage.

The semiconductor device includes at least one of first charge blocking layers 25 formed on surfaces of the data storage patterns 23, exposed through the first grooves G1, and second charge blocking layers 26 surrounding the conductive layers 21. In addition, the semiconductor device further includes the spacers 24 formed on sidewalls of the data storage patterns 23 exposed through the second grooves G2.

In this example, surfaces of the data storage patterns 23, interposed between the channel layer 28 and the conductive layers 21, are surrounded by the spacers 24 and the first charge blocking layers 25. In addition, only the sidewalls of the data storage patterns 23, interposed between the channel layer 28 and the insulating layers 22, are surrounded by the spacers 24.

According to the above-described structure, since the data storage patterns 23 of the stacked memory cells are separated from each other, data retention characteristics are improved. In addition, since the conductive layers 21 of the respective memory cells surround the data storage patterns 23, an electric field is efficiently formed when the memory cells are driven. Therefore, gate controllability is improved, and program and erase speeds are increased. In addition, since levels of voltages being applied to word lines are reduced during program and read operations, the reliability of the semiconductor device is improved.

FIGS. 3A to 3D are cross-sectional views illustrating a method of manufacturing a semiconductor device according to some embodiments.

Figure 3A:
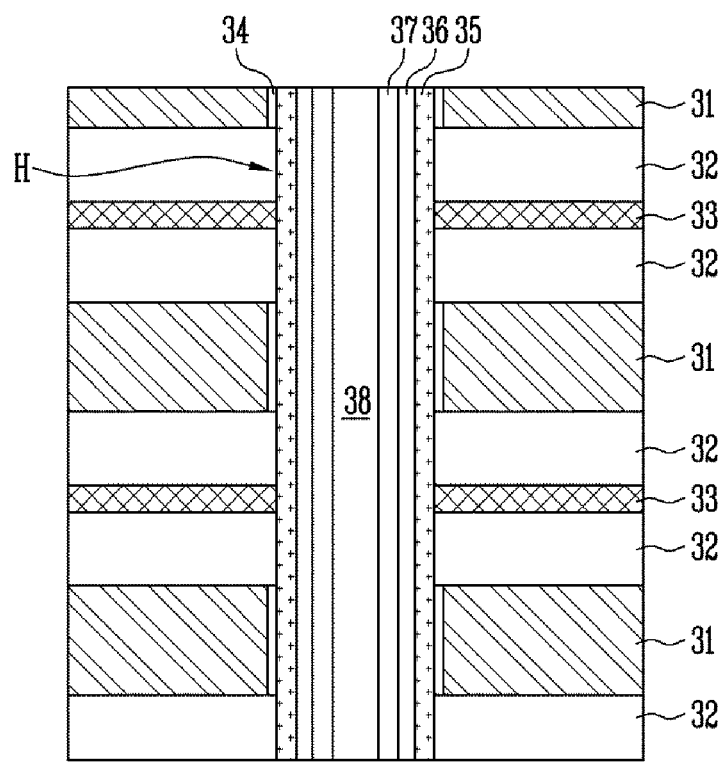
FIGS. 3A to 3D are cross-sectional views illustrating a method of manufacturing a semiconductor device according to some embodiments.

As illustrated in FIG. 3A, a plurality of first material layers 31 and a plurality of second material layers 32 are formed alternately with each other. The third material layers 33 are formed while the second material layers 32 are being formed so that the third material layers 33 and are located between the second material layers 32. In FIG. 3A, the third material layers 33 are placed right in the middle of the second material layers 32. However, the third material layers 33 are placed in upper portion or lower portion of the second material layers 32. In addition, the first material layers 31 and second material layers 32 have the same or different thicknesses, and the third material layers 33 have a smaller thickness than the first and second material layers 31 and 32.

The first material layers 31 include materials having a high etch selectivity with respect to the second and third material layers 32 and 33. In addition, the third material layer 33 includes materials having a high etch selectivity with respect to the first and second material layers 31 and 32. In some embodiments, the first material layers 31 include first sacrificial layers, such as nitride layers, the second material layers 32 includes insulating layers, such as oxide layers, and the third material layers 33 include second sacrificial layers, such as titanium nitride (TiN).

Subsequently, at least one hole H is formed through the first to third material layers 31 to 33. A data storage layer 35, a tunnel insulating layer 36 and a channel layer 37 are sequentially formed in the hole H. Subsequently, when the channel layer 37 has a tubular shape, an insulating layer 38 is formed in the channel layer 37.

Before the data storage layer 35 is formed, the buffer layers 34 are formed on surfaces of the first material layers 31 exposed through the hole H. The buffer layers 34 prevent the data storage layer 35 from being damaged during subsequent processes of forming the first grooves G1. For example, the buffer layers 34 are formed by oxidizing a predetermined thickness of the first material layers 31 exposed through the hole H.

In addition, the tunnel insulating layer 36 is formed by depositing an oxide layer onto the data storage layer 35 or by oxidizing a predetermined thickness of the data storage layer 35. When the tunnel insulating layer 36 is formed by oxidation, interface characteristics between the tunnel insulating layer 36 and the data storage layer 35 are improved.

Figure 3B:
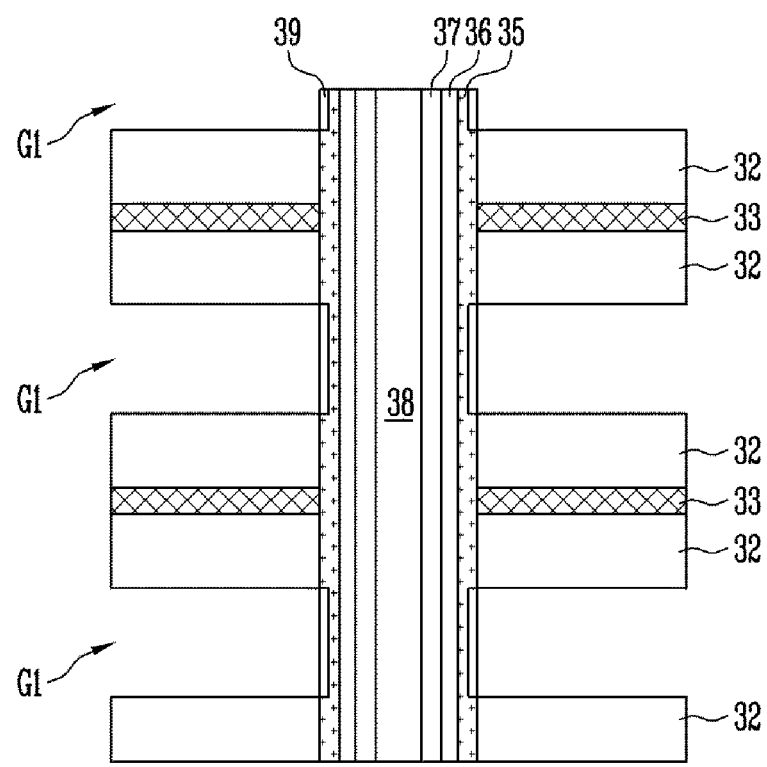

In FIG. 3B, at least one slit is formed through the first to third material layers 31 to 33. Subsequently, the first material layers 31, exposed through the slit, are removed. In this manner, the first grooves G1 are formed between the stacked second material layers 32.

Subsequently, the buffer layers 34 are removed to expose the data storage layer 35, and the data storage layer 35, exposed through the first grooves G1, are oxidized to a predetermined thickness to form first charge blocking layers 39. As a result, the data storage layer 35 has unevenness on an outer surface thereof. For example, regions corresponding to the first grooves G1 of the data storage layer 35 have a smaller thickness than other regions thereof.

For example, the buffer layers 34 remain without being removed. In this example, the buffer layers 34 function as first charge blocking layers.

Figure 3C:
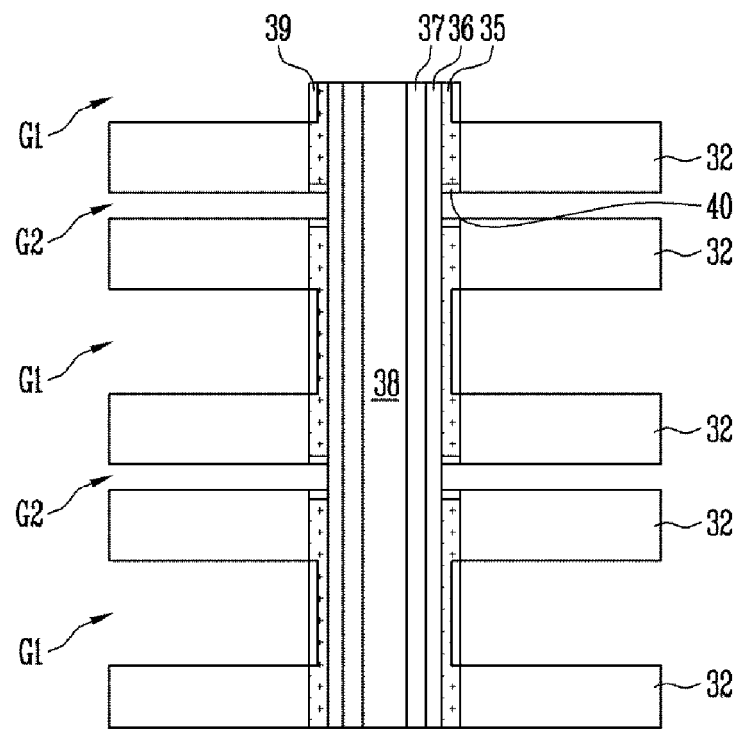

As illustrated in FIG. 3C, the third material layers 33, exposed through the slit, are removed to form the second grooves G2. The first and second grooves G1 and G2 are arranged alternately between the stacked second material layers 32.

Subsequently, the data storage layer 35, exposed through the second grooves G2, is removed, and spacers 40 are formed. In this manner, data storage patterns 35A are formed. The data storage patterns 35A are separated by the second grooves G2.

Referring to FIG. 3C, the data storage layer 35 is exposed through the second grooves G2, are etched to form the data storage patterns 35A. For example, when the data storage layer 35 is a charge trap layer including a nitride layer, the data storage layer 35 is etched using a wet dip-out process. Since the data storage patterns 35A, exposed through the first grooves G1, are protected by the first charge blocking layers 39, the data storage layer 35 is selectively etched. Subsequently, the spacers 40 are formed on sidewalls of the data storage patterns 35A exposed through the second grooves G2. For example, the sidewalls of the data storage patterns 35A are oxidized to form the spacers 40. In this manner, the spacers 40 are formed in the shape described above with reference to FIGS. 1A and 1B.

For example, the data storage layer 35, exposed through the second grooves G2, is removed by oxidizing the data storage layer 35 exposed through the second grooves G2. In this example, portions of the data storage layer 35 corresponding to the second grooves G2 are oxidized to form the spacers 40, and unoxidized portions thereof are defined as data storage patterns 35A. In this manner, the spacers 40 are formed in the shape described above with reference to FIG. 1C.

Figure 3D:
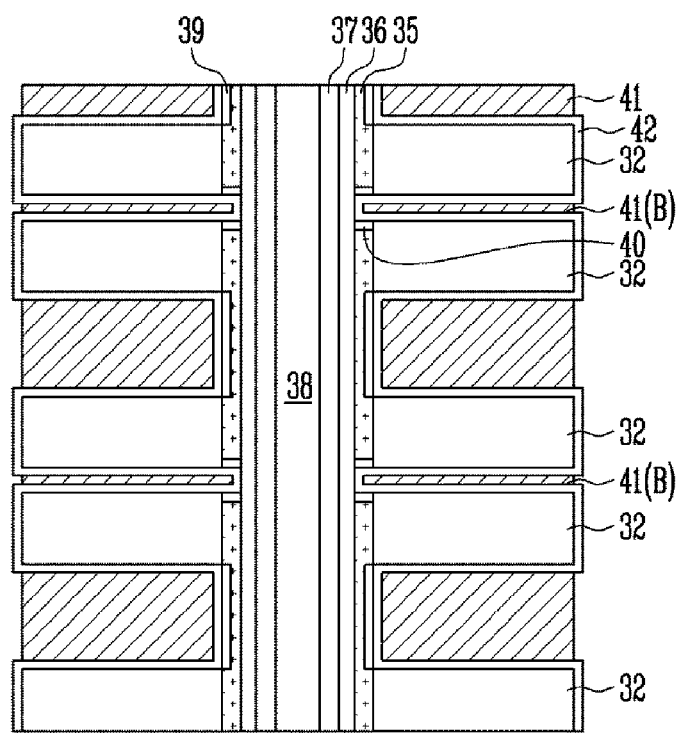

As illustrated in FIG. 3D, a second charge blocking layer 42 is formed on surfaces of the first and second grooves G1 and G2, and conductive layers 41 are subsequently formed in the first grooves G1 and the second grooves G2. The conductive layers 41 include a metal layer. The conductive layers 41 include at least one of a tungsten (W) or a tungsten nitride (WN). In addition, the second charge blocking layer 42 includes a high-k dielectric layer, such as an aluminum oxide layer ($Al_2O_3$).

The conductive layers 41, formed in the first grooves G1, are selection lines or word lines. In addition, the conductive layers 41, formed in the second grooves G2, are barrier layers B. In this manner, the conductive layers 41 are formed in the shape described above with reference to FIG. 1A.

For example, if the second grooves G2 have a width less than a deposition process limit, the second charge blocking layer 42 and the conductive layers 41 are not deposited in the second grooves G2, and the insides of the second grooves G2 remain empty. In this manner, the air gaps AG, described above with reference to FIG. 1B, are formed.

According to the above-described manufacturing processes, the data storage patterns 35A are formed by removing the third material layers 33. In addition, characteristics of the semiconductor device are improved by forming the barrier layers B or the air gaps AG in the second grooves G2.

FIGS. 4A to 4D are cross-sectional views illustrating a method of manufacturing a semiconductor device according to some embodiments. Hereinafter, a description of common contents with earlier described embodiments is omitted.

Figure 4A:
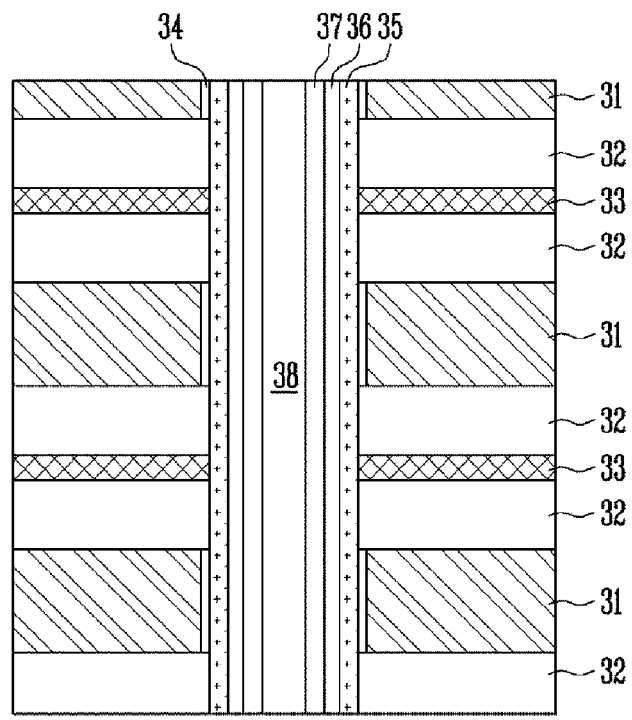
FIGS. 4A to 4D are cross-sectional views illustrating a method of manufacturing a semiconductor device according to some embodiments.

As illustrated in FIG. 4A, the plurality of first material layers 31 and the plurality of second material layers 32 are formed alternately with each other. The third material layers 33 are formed while the second material layers 32 are being formed so that the third material layers 33 are located in the second material layers 32.

Subsequently, at least one hole H is formed through the first to third material layers 31 to 33, and surfaces of the first material layers 31, exposed through the hole H, are oxidized to form the buffer layers 34. Subsequently, the data storage layer 35, the tunnel insulating layer 36 and the channel layer 37 are sequentially formed in the hole H, and the insulating layer 38 is formed in an open central portion of the channel layer 37.

Figure 4B:
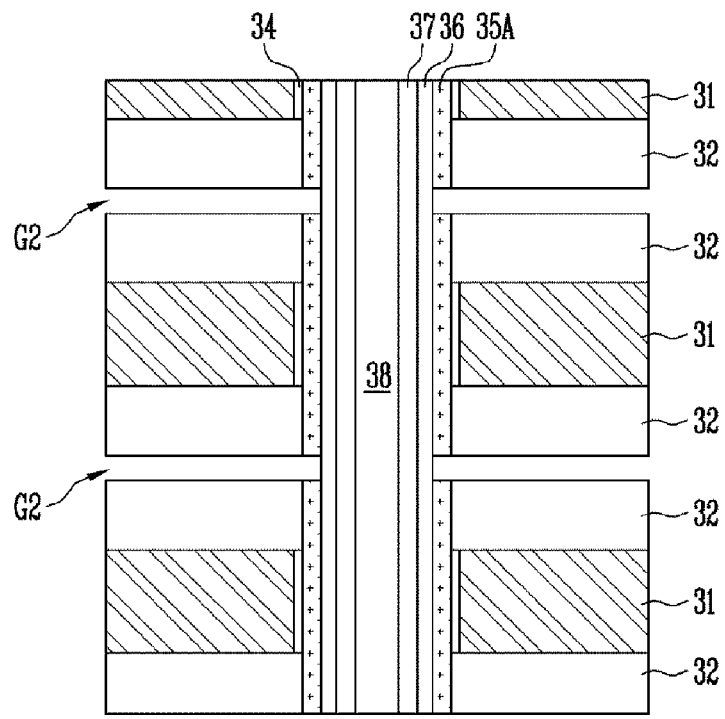

As illustrated in FIG. 4B, at least one slit is formed through the first to third material layers 31 to 33, and the third material layers 33, exposed through the slit, are removed. In this manner, the second grooves G2 are formed between the stacked second material layers 32.

Subsequently, the data storage layer 35, exposed through the second grooves G2, is etched to form the data storage patterns 35A. In this exemplary semiconductor device, the data storage layer 35 includes materials having a high etch selectivity with respect to the first and second material layers 31 and 32. For example, the data storage layer 35 includes a polysilicon layer, the first material layers 31 include a nitride layer, and the second material layers 32 include an oxide layer. In another example, the data storage layer 35 includes a charge trap layer, such as a nitride layer, the first material layers 31 includes a titanium nitride layer, and the second material layers 32 includes an oxide layer. Therefore, while the first and second material layers 31 and 32 remain, the data storage layer 35 is selectively etched.

Figure 4C:
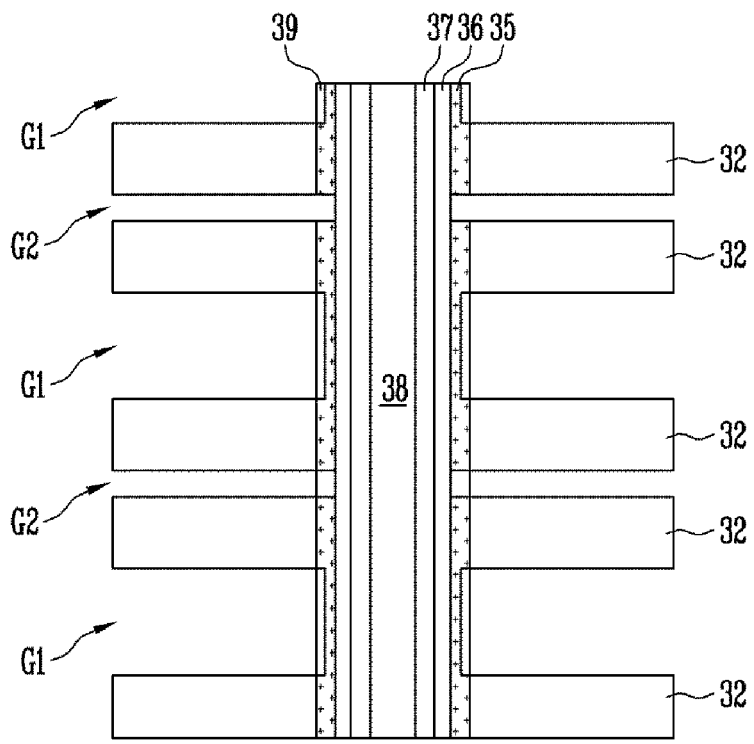

As illustrated in FIG. 4C, the first material layers 31, exposed through the slit, are removed to form the first grooves G1 between the stacked second material layers 32. Subsequently, the buffer layers 34 are removed to expose the data storage layer 35, and the exposed data storage patterns 35A are oxidized to a predetermined thickness to form the first charge blocking layers 39. Though not illustrated in FIG. 4C, during an oxidation process of the first charge blocking layers 39, the sidewalls of the data storage patterns 35, exposed through the second grooves G2, are oxidized to form spacers.

Figure 4D:
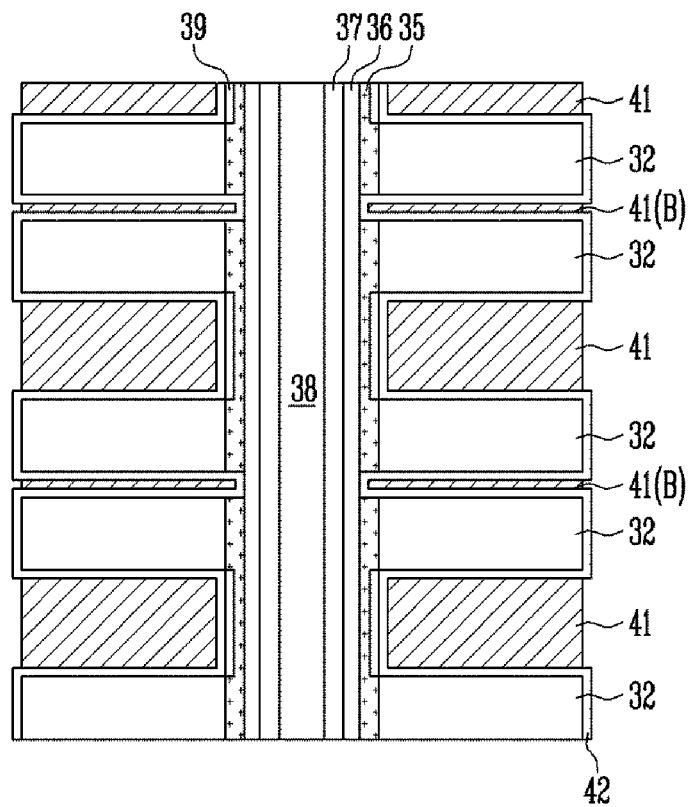

As illustrated in FIG. 4D, the second charge blocking layers 42 are formed along surfaces of the first grooves G1 and the second grooves G2. For reference, in this exemplary semiconductor device, a description has been made in reference to a case in which both the first charge blocking layers 39 and the second charge blocking layers 42 are formed. However, any one of the first charge blocking layers 39 and the second charge blocking layers 42 are formed in some embodiments.

Subsequently, the conductive layers 41 are formed in the first and second grooves G1 and G2. The conductive layers 41, formed in the first grooves G1, are selection lines or word lines. The conductive layers 41B, formed in the second grooves G2, are the barrier layers B. If the second grooves G2 have a width less than a deposition process limit, insides of the second grooves G2 remain empty to form the air gaps AG.

According to the above-described manufacturing processes, after the data storage patterns 35A are formed by patterning the data storage layer 35, the first grooves G1 are formed. Therefore, as compared to a case in which the data storage patterns 35A are formed after both of the first and second grooves G1 and G2 are formed, structural stability of a structure is improved.

FIGS. 5A to 5D are cross-sectional views illustrating a method of manufacturing a semiconductor device according to some embodiments. Hereinafter, a description of common contents with earlier described embodiments is omitted.

Figure 5A:
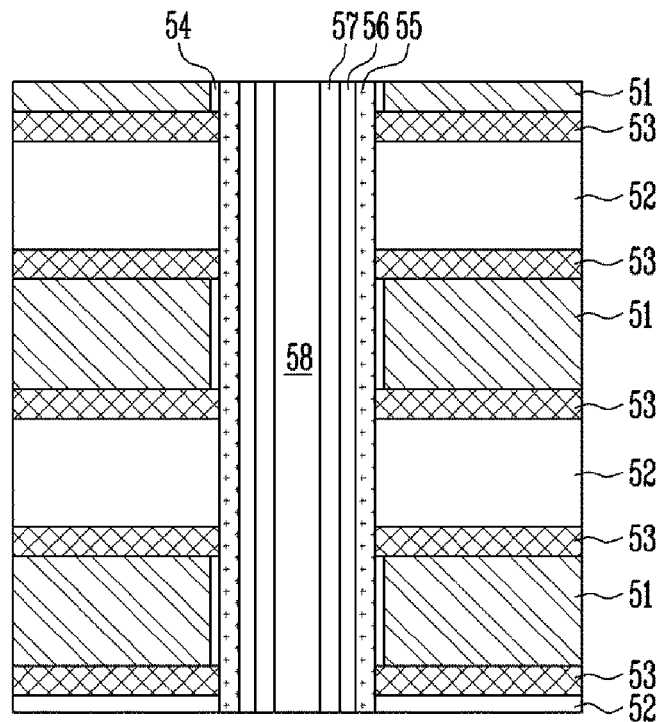
FIGS. 5A to 5D are cross-sectional views illustrating a method of manufacturing a semiconductor device according to some embodiments.

As illustrated in FIG. 5A, a plurality of first material layers 51 and a plurality of second material layers 52 are formed alternately with each other. Third material layers 53 are formed while the first and second material layers 51 and 52 are being formed alternately with each other so that each of the third material layers 53 are located between the first and second material layers 51 and 52. For example, processes of forming the second material layer 52, the third material layer 53, the first material layer 51 and third material layer 53 in a sequential manner are performed in a single cycle in some embodiments. In some embodiments the cycle is performed several times, depending on the number of memory cells to be stacked.

Subsequently, at least hole H is formed through the first to third material layers 51 to 53, and surfaces of the first material layers 51, exposed through the hole H, are oxidized to form buffer layers 54. Subsequently, a data storage layer 55, a tunnel insulating layer 56 and a channel layer 57 are formed sequentially in the hole H, and an insulating layer 58 is formed in an open central portion of the channel layer 57.

Figure 5B:
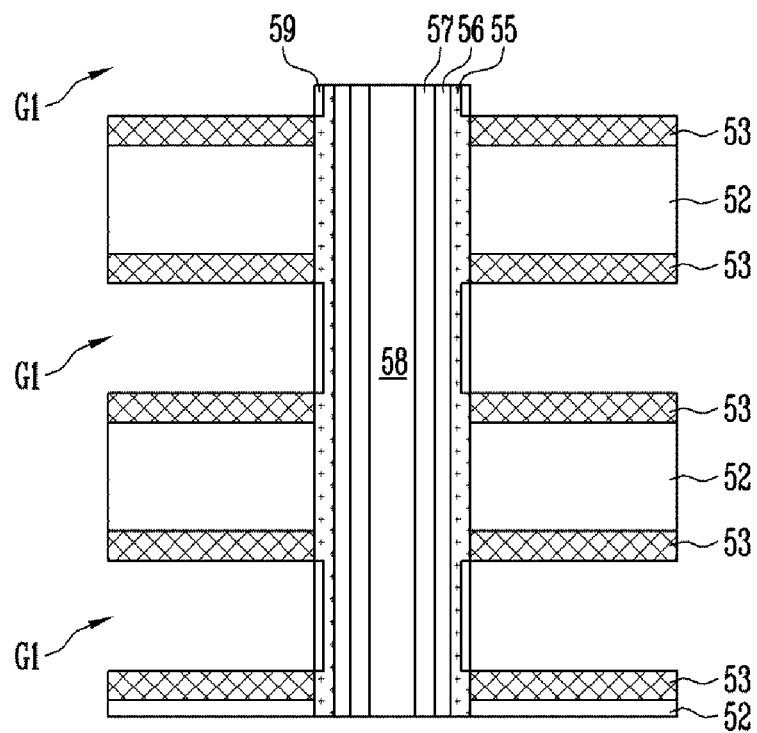

As illustrated in FIG. 5B, at least one slit is formed through the first to third material layers 51 to 53, and the first material layers 51, exposed through the slit, are removed. In this manner, the first grooves G1 are formed between the stacked second material layers 52, especially between the third material layers 53.

Subsequently, the data storage layer 55 is exposed by etching the buffer layers 54, exposed through the first grooves G1, and the exposed data storage layer 55 is oxidized to a predetermined thickness to form the first charge blocking layers 59.

Figure 5C:
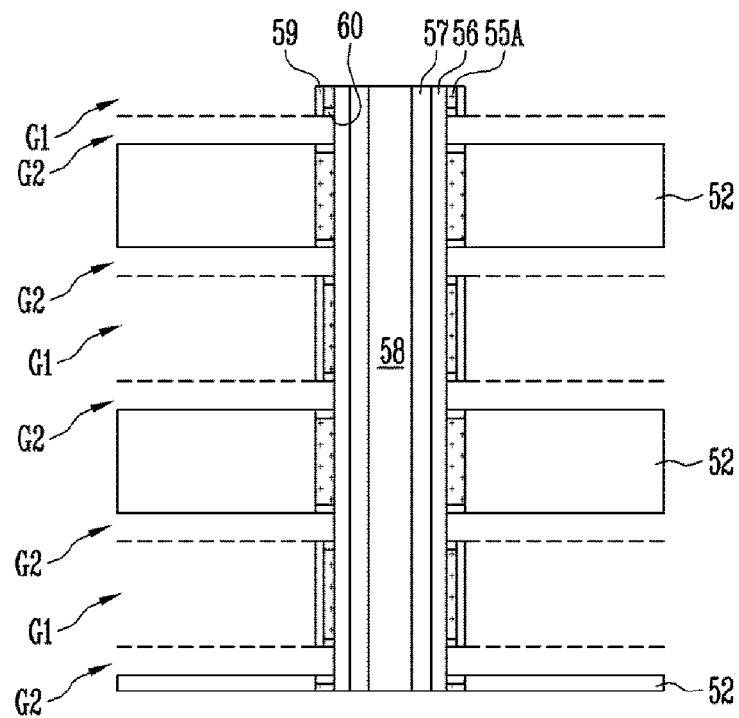

As illustrated in FIG. 5C, the third material layers 53, exposed through the slit, are removed to form the second grooves G2. The second grooves G2 are formed between the stacked second material layers 52 and located above and under the first grooves G1. In addition, the first grooves G1 and the second grooves G2 are connected in a single body to form a single space.

Subsequently, the data storage layer 55, exposed through the second grooves G2, is etched to form the data storage patterns 55A separated by the second grooves G2. Subsequently, sidewalls of the data storage patterns 55A, exposed through the second grooves G2, are oxidized to form spacers 60.

Figure 5D:
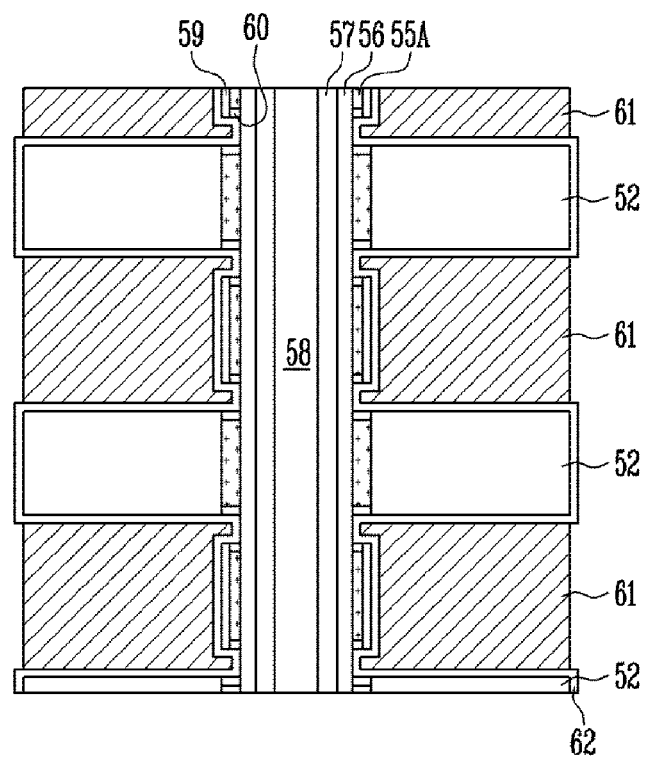

As illustrated in FIG. 5D, the second charge blocking layer 62 is formed on surfaces of the first and second grooves G1 and G2, and conductive layers 61 are formed in the first and second grooves G1 and G2. Portions of the conductive layers 61, formed in the second grooves G2, extend further toward the channel layer 57 than those of the conductive layers 61, formed in the first grooves G1. Therefore, the conductive layers 61 are formed to surround surfaces of the data storage patterns 55A exposed through the first and second grooves G1 and G2. In this manner, the conductive layers 61 are formed in the shape as described above with reference to FIG. 2.

According to the above-described manufacturing processes, the conductive layers 61 completely surround the data storage patterns 55A. Therefore, driving characteristics and reliability of the semiconductor device are improved.

Figure 6:
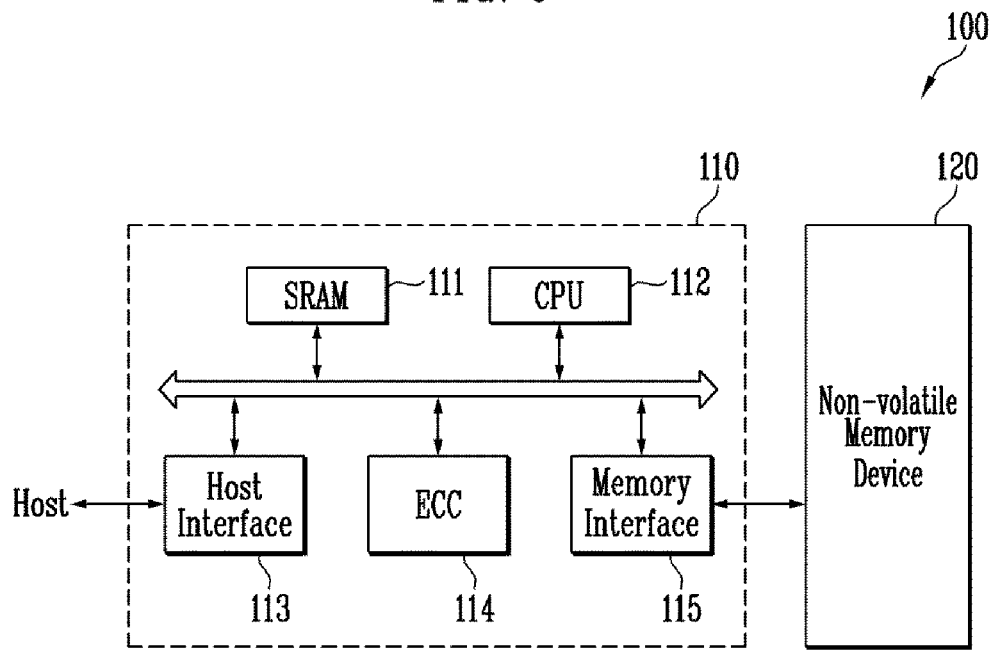
FIG. 6 is a block diagram of a memory system according to some embodiments.

FIG. 6 is a view illustrating the configuration of an exemplary memory system.

As illustrated in FIG. 6, a memory system 100 according to some embodiments includes a memory controller 110 and a non-volatile memory device 120.

The non-volatile memory device 120 includes the above-described structure. In addition, the non-volatile memory device 120 is a multi-chip package composed of a plurality of flash memory chips.

The memory controller 110 is coupled to a host and the non-volatile memory device 120. The memory controller 110 is configured to access the memory device 120 in response to a request from the host. For example, the memory controller 110 is configured to control a read operation, a write operation and an erase operation of the memory device 120. The memory controller 110 is configured to provide an interface between the non-volatile memory device 120 and the host. In addition, the memory controller 110 is configured to drive firmware for controlling the non-volatile memory device 120.

The memory controller 110 includes SRAM 111, a CPU 112, a host interface 113, an error correction code (ECC) module 114 and a memory interface 115. The SRAM 111 is used as at least one of an operation memory of the CPU 112, a cache memory between the non-volatile memory device 120 and the host, or a buffer memory between the non-volatile memory device 120 and the host. The CPU 112 performs general control operations for data exchange of the memory controller 110. The host interface 113 includes a data exchange protocol of a host being coupled to the memory system 100. The ECC module 114 detects and corrects errors included in data read from the non-volatile memory device 120. The memory interface 115 performs to interface with the non-volatile memory device 120. In some embodiments the memory controller 110 further includes as RCM that stores code data to interface with the host.

The memory system 100 having the above-described configuration is a solid state disk (SSD) or a memory card, which includes the memory device 120 and the memory controller 110. For example, when the memory system 100 is an SSD, the memory controller 110 can communicate with an external device (e.g., a host) through one of the interface protocols including USB, MMC, PCI-E, SATA, PATA, SCSI, ESDI, and IDE.

Figure 7:
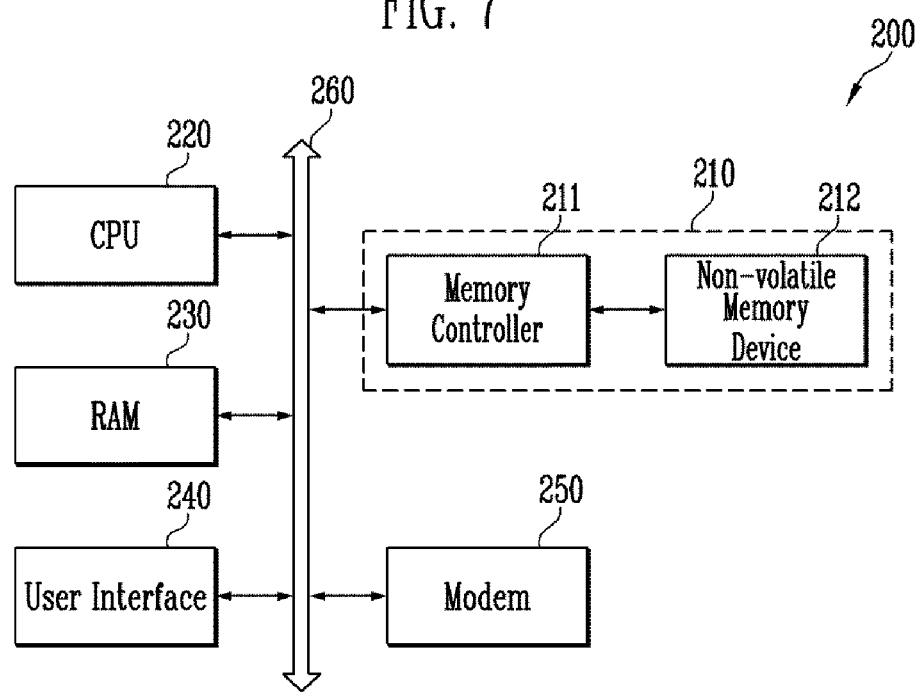
FIG. 7 is a block diagram of a computing system according to some embodiments.

FIG. 7 is a block diagram illustrating the configuration of a computing system according to some embodiments.

As illustrated in FIG. 7, a computing system 200 according to some embodiments includes a CPU 220, RAM 230, a user interface 240, a modem 250 and a memory system 210 that are electrically coupled to a system bus 260. In some embodiments, the computing system 200 is a mobile device and a battery is included to apply operating voltage to the computing system 200. In some embodiments, the computing system 200 includes application chipsets, a CMOS Image Sensor (CIS) and mobile DRAM.

Since memory cells, stacked on top of one another, include data patterns separated from each other, retention characteristics of a semiconductor device are improved.

What is claimed is:

1. A semiconductor device, comprising:
   a channel layer;
   insulating layers surrounding the channel layer and stacked along the channel layer;
   first grooves and second grooves alternately disposed on regions between the insulating layers, wherein the first grooves and the second grooves have different widths; and
   a first conductive layer in each of the first grooves,
   wherein the insulating layers are separated from each other by the first and second grooves.

2. The semiconductor device of claim 1, further comprising a plurality of data storage patterns surrounding the channel layer and separated from each other by the second grooves.

3. The semiconductor device of claim 2, further comprising first charge blocking layers formed on surfaces of the data storage patterns.

4. The semiconductor device of claim 1, further comprising second charge blocking layers formed on surfaces of the first and second grooves.

5. The semiconductor device of claim 1, further comprising a barrier layer formed in each of the second grooves.

6. The semiconductor device of claim 1, further comprising an air gap formed in each of the second grooves.

7. The semiconductor device of claim 2, further comprising spacers formed on sidewalls of the data storage patterns.

8. The semiconductor device of claim 1, wherein each of the second grooves has a smaller width than each of the first grooves.

9. A semiconductor device, comprising:
   at least one channel layer;
   insulating layers stacked while surrounding the at least one channel layer;
   first grooves and second grooves alternately interposed between the insulating layers;
   conductive layers formed in the first grooves; and
   data storage patterns surrounding the channel layers and separated from each other by the second grooves, wherein each of the data storage patterns extends along sidewalls of one of the conductive layers and two of the insulating layers located between adjacent second grooves.

10. The semiconductor device of claim 9, further comprising barrier layers formed in the second grooves.

11. The semiconductor device of claim 9, further comprising air gaps formed in the second grooves.

12. The semiconductor device of claim 9, further comprising spacers formed on sidewalls of the data storage patterns.

13. The semiconductor device of claim 9, further comprising first charge blocking layers formed on surfaces of the data storage patterns exposed through the first grooves.

14. The semiconductor device of claim 9, further comprising second charge blocking layers formed on surfaces of the first and second grooves.

15. The semiconductor device of claim 9, wherein each of the second grooves has a smaller width than each of the first grooves.

16. A semiconductor device, comprising:
   at least one channel layer;
   insulating layers stacked while surrounding the at least one channel layer;
   first grooves interposed between the insulating layers;
   second grooves interposed between the first grooves and the insulating layers, wherein the second grooves are located above and below each of the first grooves to meet the first grooves;
   data storage patterns surrounding the channel layers and separated from each other by the second grooves; and
   conductive layers formed in the first and second grooves.

17. The semiconductor device of claim 16, further comprising first charge blocking layers formed on surfaces of the data storage patterns.

18. The semiconductor device of claim 16, further comprising second charge blocking layers formed on surfaces of the first and second grooves.

19. The semiconductor device of claim 16, wherein each of the second grooves has a smaller width than each of the first grooves.

20. The semiconductor device of claim 16, wherein the conductive layers surround surfaces of the data storage patterns.

* * * * *